United States Patent
Masukawa et al.

(10) Patent No.: US 7,618,861 B2
(45) Date of Patent: Nov. 17, 2009

(54) METHOD OF MANUFACTURING NON-VOLATILE MEMORY DEVICE USING MULTIPLE ELEMENT ISOLATION REGIONS AND PERPENDICULAR EXTENSIVE DEVICE REGIONS

(75) Inventors: Masayuki Masukawa, Miyagi (JP); Masaru Seto, Miyagi (JP); Keisuke Oosawa, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 244 days.

(21) Appl. No.: 11/785,919

(22) Filed: Apr. 20, 2007

(65) Prior Publication Data

US 2007/0272968 A1 Nov. 29, 2007

(30) Foreign Application Priority Data

May 23, 2006 (JP) .............................. 2006-142475

(51) Int. Cl.
*H01L 21/336* (2006.01)
(52) U.S. Cl. ........................ 438/257; 257/239; 257/261; 257/314; 257/315; 257/316
(58) Field of Classification Search .................. 257/315, 257/239, 261, 314–316; 438/257
See application file for complete search history.

(56) References Cited

U.S. PATENT DOCUMENTS

| | | | | | |
|---|---|---|---|---|---|
| 4,380,057 | A | * | 4/1983 | Kotecha et al. | 365/184 |
| 5,021,999 | A | * | 6/1991 | Kohda et al. | 365/185.03 |
| 5,414,693 | A | * | 5/1995 | Ma et al. | 365/185.1 |
| 6,151,248 | A | * | 11/2000 | Harari et al. | 365/185.14 |
| 6,747,896 | B2 | * | 6/2004 | Wong | 365/185.18 |
| 2005/0029577 | A1 | * | 2/2005 | Nishizaka et al. | 257/315 |

FOREIGN PATENT DOCUMENTS

| | | |
|---|---|---|
| JP | 9-97849 | 4/1997 |
| JP | 2003-258128 | 9/2003 |

\* cited by examiner

*Primary Examiner*—Marcos D. Pizarro
*Assistant Examiner*—Raj Gupta
(74) *Attorney, Agent, or Firm*—Rabin & Berdo, PC

(57) ABSTRACT

Separate first and second floating gates for attracting carriers transferring in a transistor structure having a channel region and first and second main electrode regions into charge storage films therebelow are formed so as to largely face a control gate. The control gate between the separate first and second floating gates faces to the channel region via thin interlayer insulating layer. Therefore, a semiconductor device according to the present invention can inject electrons the charge storage film without causing writing errors in a writing operation, and therefore can increase in reliability thereof, control a writing voltage, prevent loss of the electrons stored in the charge storage film, and reliably apply a bias voltage to a channel region.

2 Claims, 8 Drawing Sheets

METHOD OF MANUFACTURING NON-VOLATILE MEMORY DEVICE USING MULTIPLE ELEMENT ISOLATION REGIONS AND PERPENDICULAR EXTENSIVE DEVICE REGIONS

BACKGROUND OF THE INVENTION

1. Field of the Invention

The present invention relates to a semiconductor device including a memory functional body capable of storing an electric charge, and a method of manufacturing the same.

2. Description of the Related Art

A non-volatile memory device comprising a transistor capable of storing two bits of information in one memory cell has been conventionally known. The non-volatile memory device has usually silicon nitride films, each capable of storing an electric charge and thus serving as a memory functional bodies. The silicon nitride films are formed on side surfaces of a gate electrode or on a substrate adjacent to a gate electrode.

A conventional semiconductor device having silicon nitride films, each having an electric charge storing function, is disclosed in, for example, Japanese Unexamined Patent Application Publication No. H09-97849 (document D1). A semiconductor device disclosed in the document D1 will now be described in reference to the accompanying drawings.

FIG. 1 is a cross-sectional side view of a semiconductor device disclosed in the document D1. As shown in FIG. 1, the semiconductor device of the document D1 includes a substrate 115 in which a channel region 111 and first and second main electrode regions 113a, 113b sandwiching the channel region 111 are formed. The first and second main electrode regions 113a and 113b, which are separated from each other, correspond to source and drain regions. In FIG. 1, one of main electrode regions formed at the right side of the channel region 111 corresponds to the first main electrode region 113a. The other of the main electrode regions formed at the left side of the channel region 111 corresponds to the second main electrode region 113b. A gate oxide film 117 is formed on an upper surface of the channel region 111 of the substrate 115. A control gate 119 is formed on the gate oxide film 117. The semiconductor device of the document D1 further includes a silicon nitride film 121 with a uniform thickness. The silicon nitride film 121 covers an upper surface of the control gate 119, both right and left side surfaces of the control gate 119, and an upper surface of the substrate 115 via a lower oxide film 125. The silicon nitride film 121 serves as a memory functional body. The silicon nitride film 121 specifically has a function of accumulating and storing electrons injected thereinto during a writing operation, in other words, an electric charge storing function. Floating gates 123 are respectively formed on upper surface of two portions of the silicon nitride film 121 so as to sandwich the right and left side surfaces of the control gate 119. In FIG. 1, one of the floating gates 123 formed at the right side of the control gate 123 corresponds to a floating gate 123a. The other of the floating gates 123 formed at the left side of the control gate 123 corresponds to a floating gate 123b. The lower silicon oxide 125 with a uniform thickness is formed between the substrate 115 and the silicon nitride film 121. The lower silicon oxide film 125 absorbs a stress difference between the substrate 115 and the silicon nitride film 121. An upper silicon oxide 127 is formed on an upper surface of the silicon nitride film 121. The upper silicon oxide 127 absorbs a stress difference between the silicon nitride film 121 and the floating gates 123. Hereafter, a layered body configured by the lower silicon oxide film 125, the upper silicon oxide film 127, and the silicon nitride film 121 is referenced to as an ONO film 129. In FIG. 1, two portions of the ONO film 129 formed between the floating gates 123 and the substrate 115 respectively correspond to ONO films 129a. Two portions of the ONO film 129 formed between the floating gates 123 and the control gate 119 respectively correspond to ONO films 129b. The ONO film 129 electrically isolates the control gate 119 from the floating gates 123.

In the semiconductor device of the document D1 having such elements and structure, for writing information into the silicon nitride film serving as a memory functional body, a voltage is applied across the control gate 119 and either one of the main electrode regions. The writing operation is performed by injecting electrons into the silicon nitride film 121. The writing operation will now be described in the case that a voltage is applied across the control gate 119 and the first main electrode region 113a.

In response to an applied voltage across the control gate 119 and the first main electrode region 113a, a voltage is induced on both of the floating gates 123 sandwiching the control gate 119 via the ONO film 129. Since the induced voltage is applied across the floating gate 123b and the second main electrode region 113b located below the floating gate 123b, an electric potential difference between the floating gate 123b and the second main electrode region 113b increases. Under the increased electric potential difference, electrons of the second main electrode region 113b are attracted in a direction toward the floating gate 123b and thus are partially injected into the silicon nitride film 121 located between the floating gate 123b and the second main electrode region 113b. On the other hands, when a voltage is applied across the control gate 119 and the second main electrode region 113b, electrons are injected into the silicon nitride film 121 located between the first floating gate 123a and the first main electrode region 113a.

In such writing operations, for the purpose of injecting the electrons into the silicon nitride film 121, it is necessary to increase the electric potential difference between one of the floating gates 123 and either one of the first or the second main electrode regions 113 to which the voltage is not applied. It is more preferable that a large induced voltage is applied to the floating gates 123 as much as possible.

The applied voltage on one of the floating gates 123 is dependent upon a coupling ratio Cr between the control gate 119 and one of the floating gates 123. The coupling ratio Cr is given by an equation $Cr=C2/(C1+C2)$. C1 represents an electric capacity of the ONO film 129a formed between the floating gates 123 and the substrate 115. C2 represents an electric capacity an insulating film. In this case, the ONO film 129b formed between the floating gate 123 and the control gate 119 serves as the insulating film. The induced voltage applied to the floating gate 123 is given by a voltage at the control gate 119 multiplied by the coupling ratio Cr. Thus, by increasing the coupling ratio, the induced voltage applied to the floating gate 123 can be increased. As apparent from the equation, it is preferably configured for increasing the coupling ratio that the ONO film 129b formed between the floating gate 123 and the control gate 119 have a large electric capacity value. The electric capacitor of the ONO film 129b can be increased by increasing surface area of the floating gate 123 facing to the control gate 119 via the ONO film 129b. In addition, the electric capacitor of the ONO film 129b formed between the floating gate 123 and the control gate 119 can be increased by decreasing a thickness thereof.

In the semiconductor device disclosed in the document D1, only the side surfaces of the control gate 119 respectively face the floating gates 123 via the insulation film. Thus, the surface area of the control gate 119 facing to the floating gates 123 is relatively small.

In the semiconductor device disclosed in the document D1, the insulation film formed between the floating gate 123 and the control gate 119 corresponds to the ONO film 129 which are configured by the lower silicon oxide film 125, the upper silicon oxide film 127, and the silicon nitride film 121. Since the ONO film 129 includes such the three films, the ONO film 129 is relatively large in thickness.

For these reasons, it is difficult in the semiconductor device of the document D1 to provide a large increase in the electrical potentials at the floating gates 123 and efficiently inject the electrons into the silicon nitride film 121 at the time of a writing operation. Thus, there arises a problem that writing errors occur in a writing operation, thereby decreasing in reliability of the device.

A semiconductor device for solving the problems the problem disclosed in, for example, Japanese Unexamined Patent Application Publication No. 2003-258128 (a document D2).

A third embodiment (hereafter of document "D2-1") of the semiconductor device of the document D2 does not include an ONO film such as the ONO film of the document D1. The ONO film of the document D1 covers the upper surface of and both side surfaces of the control gate. The semiconductor device of the document D2-1 includes ONO films formed only on an upper surface of a substrate, each of the ONO films having a silicon nitride film which serves as a memory functional body. The semiconductor device of the document D2-1 does not include a floating gate. The semiconductor device of the document D2-1 has a metallic film with which the ONO films and the control gate are covered. In the semiconductor device of the document D2-1, the side surface of the ONO film directly contacts to the side surface of the control gate.

Since the semiconductor device of the document D2-1 does not include the floating gate, a voltage is directly applied to the control gate. Thus electrons of one of the first and second main electrode regions to which the voltage is not applied can transfer. The voltage applied to the control gate directly influences on an electron injection into the silicon nitride film during a writing operation. Therefore, by increasing the applied voltage on the control gate, the amount of the electrons injected into the silicon nitride film can be increased.

A fourth embodiment (hereafter of document D2-2) of the semiconductor device disclosed in the document D2 will now be described with reference to FIG. 2. FIG. 2 is a cross-sectional view of the semiconductor device of the document D2-2. The semiconductor device of the document D2-2 includes a substrate 211 in which a channel region 213 and first and second main electrode regions 214 sandwiching the channel region 213 are embedded. The first and second main electrode regions 214 separated from each other correspond to a source and drain. A floating gate central region 216 is formed on an upper surface of the channel region 213 via a gate oxide film 215. ONO films 217 having a thickness thinner than that of the floating gate central region 216 are formed on both side surfaces of the floating gate central region 216 and partially on the upper surface of the channel region 213. Each of the ONO films 217, in similar with the ONO films of the document D1, is configured by a lower silicon oxide film 219 serving as a memory functional body, a silicon nitride film 221, and an upper silicon oxide film 223. A floating gate side part 225 is formed so as to cover an upper surface of the ONO films 217 and the floating gate central region 216. Hereinafter, the floating gate central region 216 and the floating gate side part 225 are referenced to as a floating gate 227. The floating gate 227 of FIG. 2 corresponds to the floating gate 123 of the semiconductor device of the document D1. In the semiconductor device of the D2-2, a control gate 231 is formed so as to cover a layered body including the floating gate 227 and the ONO film 217 and additionally cover an upper surface of the substrate 211 via a silicon oxide film 229.

In the semiconductor device of the document D2-2, the upper surface of and both side surfaces of the floating gate 227 face to the control gate 231 via the silicon oxide film 229 serving as an insulation film. Thus, one surface of the floating gate 227 faces to one surface the control gate 231 via the silicon oxide film 229. A surface area of the floating gate 227 facing to the control gate 231 can be largely increased in comparison with the semiconductor device of the document D1.

In the semiconductor device of the document D2-2, only the silicon oxide film 229 serving as an insulation film is formed between the floating gate 227 and the control gate 231. The silicon oxide film 229 serving as an insulation film formed between the floating gate 227 and the control gate 231 can be decreased in its thickness in comparison with the semiconductor device of the document D1 having the ONO film configured by three films.

In the semiconductor device of the document D2-2, an electrical potential at the floating gate 227 can be easily increased in comparison with the semiconductor device of the document D1. Electrons can be easily injected into the silicon nitride film 221 during a writing operation. Thus, the semiconductor device of the document D2-2 helps solves the problem that writing errors occur in a writing operation, thereby decreasing in reliability of the device.

However, in the semiconductor device of the document D2-1 which does not include a floating gate, there is another problem. Electrons are injected into the silicon nitride film not by utilizing an induced voltage on a floating gate but applying a voltage directly to the control gate. Therefore, there is a possibility that information is written into a cell which is not intended to write due to an excess applied voltage.

The semiconductor device of the document D2-1 dose not include a floating gate, thus an electric field of the control gate is directly impressed into the silicon nitride film without intermediation of the floating gate at the time of a reading operation. The electric field of the control gate causes loss of electrons stored in the silicon nitride film of a memory functional body. Therefore, in the semiconductor device of the document D2-1, an electric field of the control gate is directly impressed into the silicon nitride film, thus causing loss of the stored electrons in the case of, for example, repeated reading operations.

The semiconductor device of the document D2-2 includes the floating gate and the ONO film entirely covering the upper surface of the channel region. The control gate is formed above the floating gate and the ONO film via the insulation film. The insulation film, the floating gate, and the ONO film are located between the channel region of the substrate and the control gate, so that the channel region does not face to the control gate at all. Therefore, it is difficult to apply a bias voltage to the channel region by applying a voltage to the control gate, thus decreasing driving ability of the semiconductor device.

SUMMARY OF THE INVENTION

An object of the present invention is to provide a semiconductor device which can inject electrons into a silicon nitride film without causing writing errors in a writing operation, and therefore can increase in reliability thereof, control a writing voltage, prevent loss of electrons stored in the silicon nitride film, and reliably apply a bias voltage to a channel region and a method of manufacturing the same.

According to a first aspect of the present invention, there is a provided a semiconductor device comprising a semiconductor substrate including an element region, a channel region formed in the element region, first and second main electrode regions formed in the element region so as to sandwich the channel region. The semiconductor device further comprises first and second ONO films, separated from each other, formed on an upper surface of the channel region so as to have respective edges adjacent to boundary lines between the channel region and the first and second main electrode regions. Each of the first and second ONO films includes a lower oxide film, a charge storage nitride film formed on an upper surface of the lower oxide film, and an upper oxide film formed on an upper surface of the charge storage nitride film. The semiconductor device further comprises first and second floating gates respectively formed on upper surfaces of the first and second ONO films, an interlayer insulating film having a substantially uniform thickness covering the first and second ONO films, the first and second floating gates, and an upper surface of the element region, and a control gate formed on an upper surface of the interlayer insulating film so as to fill spaces between the first and second ONO films and between the first and second floating gates.

According to a second aspect of the present invention, there is a provided a method of manufacturing the semiconductor device according to the first aspect, including first to eighth steps as follows.

In a first step, a semiconductor substrate are prepared including a plurality of element isolation regions disposed at substantially equal intervals in a direction substantially perpendicular to a longitudinal direction thereof and an element region exposed from the plurality of element isolation regions. A first conductive type impurity region in the element region of the semiconductor substrate are formed by doping impurities of a first conductive type into the element region.

In a second step, a masking film is formed on a portion of the first conductive type impurity region and then doping impurities of a second conductive type whose conductivity is oppose to that of the first conductive type into the first conductive type impurity region so as to form a channel region having the first conductive type and first and second main electrode regions having the second conductive type. The first and second main electrode regions sandwich the channel region.

In a third step, the masking film is removed and then a lower oxide film, a charge storage nitride film, and an upper oxide film are formed in sequence so as to cover over an upper surface of the semiconductor substrate, so as to form an ONO film including the lower oxide film, the charge storage nitride film, and the upper oxide film.

In a fourth step, a floating gate material layer is formed on the ONO film, so as to form a layered product including the ONO film and the floating gate material layer.

In a fifth step, the layered product is partially etched away, thus the layered product is left as first and second remnant regions separated from each other. The first and second remnant regions substantially parallel to each other extend in a direction perpendicular to the longitudinal direction of the element isolation regions. The first and second remnant regions respectively have edges adjacent to boundary lines between the channel region and the first and second main electrode regions. The first and second remnant regions respectively have first and second floating gates which are formed from the floating gate material layer. The first and second remnant regions respectively have first and second ONO films which are formed from the ONO film.

In a sixth step, an interlayer insulating film with a substantially uniform thickness is formed so as to cover the first and second remnant regions and an upper surface of the semiconductor substrate.

In a seventh step, a control gate is formed so as to fill a space between the first and second remnant regions and cover the interlayer insulating film.

In an eighth step, the control gate, the interlayer insulating film, the first and second floating gates, and the first and second ONO films which are formed on/above the upper surface of the plurality of element isolation regions and upper surfaces of portions of the element region extending in the longitudinal direction of the element isolation region are removed.

According to a third aspect of the present invention, there is a provided a method of manufacturing the semiconductor device according to the first aspect, including first to tenth steps as follows.

In a first step, a semiconductor substrate are prepared including a plurality of element isolation regions disposed at substantially equal intervals in a direction substantially perpendicular to a longitudinal direction thereof and an element region exposed from the plurality of element isolation regions. A first conductive type impurity region in the element region of the semiconductor substrate are formed by doping impurities of a first conductive type into the element region.

In a second step, a lower oxide film, a charge storage nitride film, and an upper oxide film are formed in sequence so as to cover over an upper surface of the semiconductor substrate, so as to form an ONO film including said lower oxide film, the charge storage nitride film, and the upper oxide film.

In a third step, a gate formation sacrificial film is formed on a portion of the ONO film.

In a fourth step, a floating gate material layer is formed so as to cover an upper surface of the ONO film and the gate formation sacrificial film.

In a fifth step, the floating gate material layer is partially removed so as to form remnant portions of the floating gate material layer as first and second floating gates sandwiching the gate formation sacrificial film.

In a sixth step, impurities having a second conductivity type whose conductivity is oppose to the first conductivity type are doped into the first conductive type impurity region while utilizing the first and second floating gates as a mask, so as to form first and second main electrode regions having the second conductivity type and a channel region having the first conductivity type. The cannel region sandwiched by the first and second main electrode regions is positioned below the gate formation sacrificial film and the first and second floating gates;

In a seventh step, the gate formation sacrificial film and the ONO film are removed excluding portions thereof under the first and second floating gates, so as to form the portions of the gate formation sacrificial film and the ONO film as separate first and second remnant regions substantially parallel to each other extending in a direction perpendicular to the longitudinal direction of the element isolation region. The first and second remnant regions respectively have first and second floating gates which are formed from the floating gate material layer. The first and second remnant regions respectively have first and second ONO films which are formed from the ONO film.

In an eighth step, an interlayer insulating film with a substantially uniform thickness is formed so as to cover the first and second remnant regions and an upper surface of the semiconductor substrate.

In a ninth step, a control gate is formed so as to fill a space between the first and second remnant regions and cover the interlayer insulating film.

In an tenth step, the control gate, the interlayer insulating film, the first and second floating gates, and the first and second ONO films which are formed on/above the upper surface of the plurality of element isolation regions and upper surfaces of portions of the element region extending in the longitudinal direction of the element isolation region are removed.

The semiconductor device according to the first aspect of the present invention includes the first and second floating gates formed above the channel region. The semiconductor device also includes the control gate, with which the space between the first and second floating gates are completely filled and the first and second floating gates are covered via the interlayer insulating film.

Thus, each of the first and second floating gates has three surfaces facing to the control gate 51 via the interlayer insulating film 49, one of which is an upper surface of each the first and second floating gates and the others of which are both side surfaces of each the first and second floating gate. Thus, surface areas of the floating gates facing to the control gate 51 can be increased in comparison with the conventional semiconductor device of the document D1 where the floating gate has only one surface facing to the control gate.

The semiconductor device according to the first aspect of the present invention further includes the first and second ONO films respectively having the first and second charge storage nitride films, both of which respectively operate as memory functional bodies. The first and second ONO films are formed under the first and second floating gates, respectively. Only the interlayer insulating film serving as an insulating film is formed between the first and second floating gates and the control gate. Thus, a thickness of the interlayer insulating film formed between the floating gates and the control gate can be decreased in comparison with the conventional semiconductor device of the document D1 where the ONO film composed of the three films is formed between the floating gates and the control gate.

According to the semiconductor device, surface areas of the first and second floating gates facing to the control gate 51 can be largely increased. Additionally the thickness of the insulating film formed between the first and second floating gates and the control gate can be decreased. Voltage applied to the first and second floating gates can be increased in comparison with the conventional semiconductor device of the document D1. Therefore, electrons are prone to be trapped into the first and second charge storage nitride films respectively serving as memory functional bodies, so that the semiconductor device according to the present invention can improve such the problems as a writing operation error and a lower reliability in a writing operation.

In the semiconductor device manufactured by the first embodiment, electrons are injected into the first and second charge storage nitride films, in other words, a writing operation is performed by applying a writing voltage applied to the first and second floating gates. The writing voltage is controlled so that electrons are not injected into an unintended memory cell, which is different from the conventional semiconductor device of the document D2-1 where a writing operation is directly performed by applying a writing voltage on the control gate.

In the semiconductor device manufactured by the first embodiment, the first and second ONO films respectively including the first and second charge storage nitride films are only formed below the first and second floating gates, respectively. The first and second charge storage nitride films respectively operate as memory functional bodies. In addition, the first and second floating gates and the first and second ONO films are covered with the interlayer insulating film. The control gate does not directly contact to the first and second ONO films. Thus, an electric field of the control gate, which generates during a reading operation for the first and second charge storage nitride films, is not directly impressed into the first and second charge storage nitride films since the electric field of the control gate is absorbed by the first and second floating gates and the interlayer insulating film. Accordingly, the semiconductor device manufactured by means of the first embodiment can prevent loss of the electrons respectively retained in the first and second charge storage nitride films even in the case that reading operations are repeatedly performed in the similar way of the conventional semiconductor device of the document D2-1.

In the semiconductor device manufactured by the first embodiment, the upper surface of the channel region between the first and second floating gates faces to the control gate, with which the space between the first and second floating gates is covered, via the interlayer insulating film. A bias voltage can be easily applied to the channel region by applying a voltage across the control gate and the first and second electrode regions. Therefore, the semiconductor device manufactured by the first embodiment can improve a lowering of driving ability in comparison with the conventional semiconductor device of the document D2-2 where the insulating film, the floating gate, and the ONO film are formed between the channel region and the control gate of the substrate.

According to the second aspect of the present invention, in the fifth step, the layered product is partially etched away, thus remnant portions of the layered product, which is not etched away, are formed as separate first and second remnant regions substantially in parallel with each other. The first and second remnant regions extend in a direction substantially perpendicular to the longitudinal direction of the element isolation regions. The first and second remnant regions respectively have edges adjusted to boundary lines between the channel region and the first and second main electrode regions. The first and second remnant regions respectively have first and second floating gates which are formed from the floating gate material layer. The first and second remnant regions respectively have first and second ONO films which are formed from the ONO film.

The first and second floating gates are separated from each other. An upper surface of the channel region faces to the control gate via the interlayer insulating film. Thus, by applying a voltage to the control gate, a bias voltage can be effectively applied to the channel region via interlayer insulating film.

According to the third aspect of the present invention, the gate formation sacrificial film sandwiched by the first and second floating gates is formed on the upper surface of the ONO film. The floating gate material layer covering over the gate formation sacrificial film is partially removed so as to form the separate first and second floating gates. Subsequently, the gate formation sacrificial film is selectively removed.

According to the third aspect of the present invention, the first and second floating gates are separated from each other by the gate formation sacrificial film 53. The length of the gate formation sacrificial film is configured on the basis of gate lengths of the first and second floating gates and a separate distance between the first and second floating gates. Thus, the gate lengths and the separation distance of the first and second floating gates are configured with accuracy. Therefore, the first and second floating gates with more accuracy can be formed in accordance with their designs in comparison with the semiconductor device manufactured by the first aspect of the present invention where the gate lengths and the separation length are configured at the time of removing the floating gate material layer. Even if miniaturization of the elements is accompanied by miniaturization of the semiconductor chip, a size of the gate formation sacrificial film can be configured on the basis of a design of a given semiconductor device. Thus, the gate lengths of the first and second floating gates and the separation distance therebetween can be configured with more accuracy.

According to the third aspect of the present invention, by utilizing the gate formation sacrificial film and the first and second floating gates as a mask, the first and second main electrode regions sandwiching the channel region are formed in the sixth step by doping the impurities of the second conductive type.

It is therefore that the third aspect of the present invention can improve a manufacture throughput and reduce manufacturers' cost in comparison with the first embodiment where the mask 19 is not required for forming the channel region.

According to the third aspect of the present invention, the impurities of the second conductive type are doped while utilizing the gate formation sacrificial film and the first and second floating gates as a mask, thus forming the channel region as a second conductive type impurity undoped region of the semiconductor substrate. The channel region is masked by the gate formation sacrificial film and the first and second floating gates, so that the impurities of the second conductive type are not doped thereinto. The channel region is formed after forming the first and second floating gates. Therefore, the channel region having a channel length with accuracy is formed in comparison with the first embodiment in which the first and second floating gates are formed after forming the channel region.

DETAILED DESCRIPTION OF THE INVENTION

Figure 1:
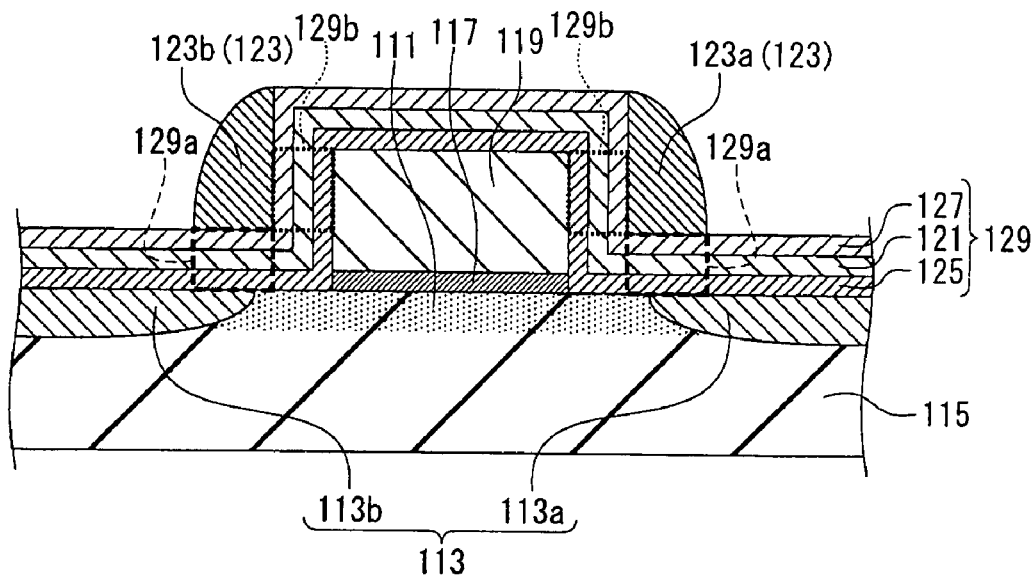
FIG. 1 is a cross sectional side view showing a conventional semiconductor device.
Figure 2:
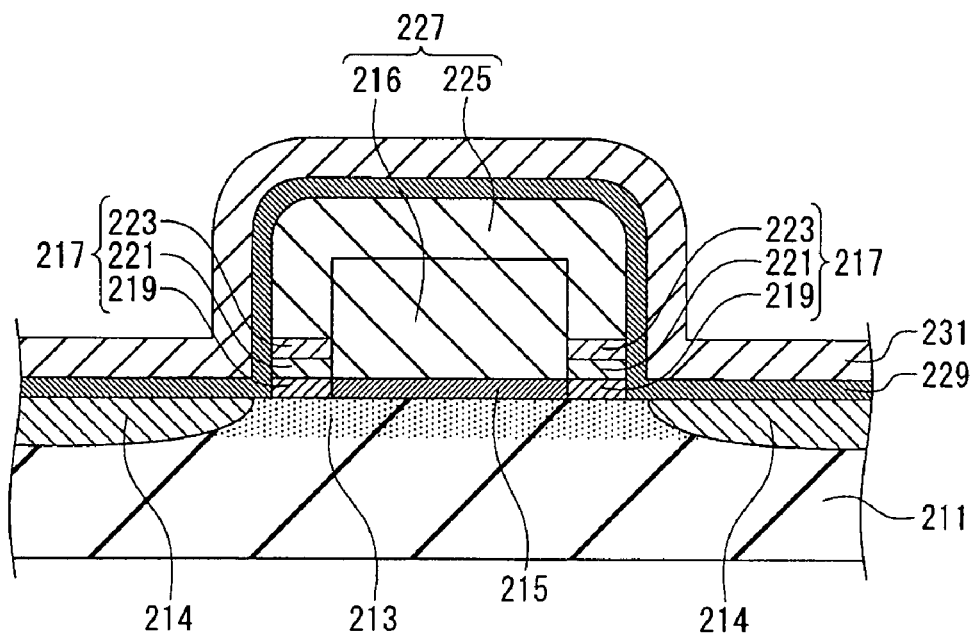
FIG. 2 is a cross sectional side view showing a conventional semiconductor device.

A semiconductor device of the present invention and a method of manufacturing the same will now be described in reference to drawings. Each of the accompanying drawings schematically illustrates only shapes of, sizes of, and arrangements of elements of the semiconductor device in extent to which the present invention can be easily understood. Therefore, the elements are not limited to embodiments illustrated in the drawings.

FIRST EMBODIMENT

A first embodiment of the method of manufacturing the semiconductor device according to the present invention will now be described. A semiconductor device manufactured by the first embodiment comprises a channel region, separate first and second floating gates formed above the channel region, and a control gate covering over the first and second floating gates. The first embodiment of the method of manufacturing the semiconductor device according to the present invention includes the following first to eighth steps. Each of the steps will be described in sequence.

Figure 3:
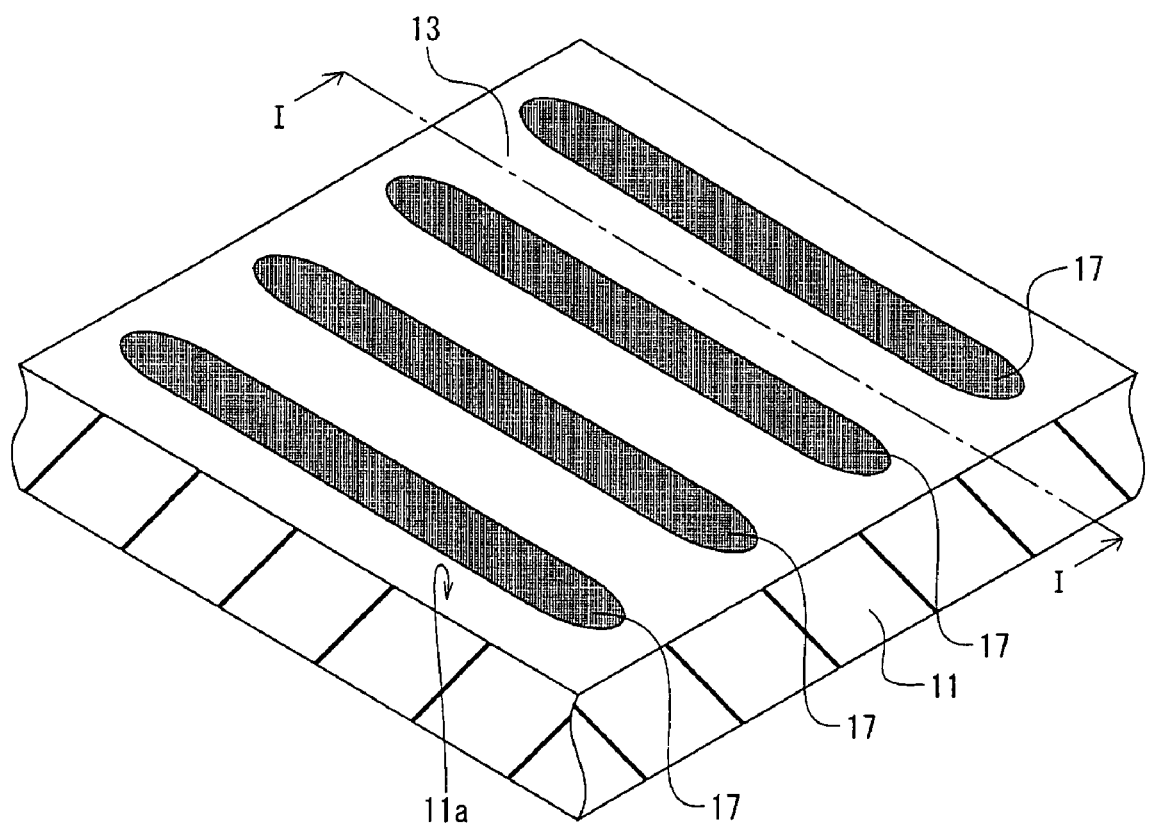
FIG. 3 is a perspective view showing a semiconductor substrate of a semiconductor device manufactured by first and second embodiments of the present invention.

FIG. 3 is a perspective view of a semiconductor substrate 11 prepared by the first embodiment of the present invention. The semiconductor substrate 11 is formed from, for example, a silicon single crystal and a conventional compound composed of silicon. As shown in FIG. 3, the semiconductor substrate 11 includes a plurality of element isolation regions 17 and an element region 13 in a chip region. The plurality of element isolation regions 17 is disposed at substantially equal intervals perpendicular to a longitudinal direction thereof. An upper surface 11a of the semiconductor substrate 11 includes upper surfaces of the plurality of element isolation regions 17 and an upper surface of the element region 13 exposed from the upper surfaces of the plurality of element isolation regions 17. The plurality of element isolation regions 17 electrically isolate elements of transistors such as a channel region and first and second electrode regions formed in the element region 13. The plurality of element isolation regions 17 are formed by a conventional method such as a LOCOS method, a STI method, and other suitable method.

In the first embodiment, one of the transistor structures is formed on one portion of the element region 13 sandwiched by two element isolation regions 17 adjacent to each other. Each of the transistors had two silicon nitride films capable of storing two bits information therein, each of which serves as a memory functional body. For simplicity, the first embodiment is described with paying attention to the one portion of the element region 13 sandwiched by two adjacent element isolation regions 17. Each of the steps of the first embodiment will be described in reference to a cross-sectional side view taken in I-I line of FIG. 3.

Figure 4A:
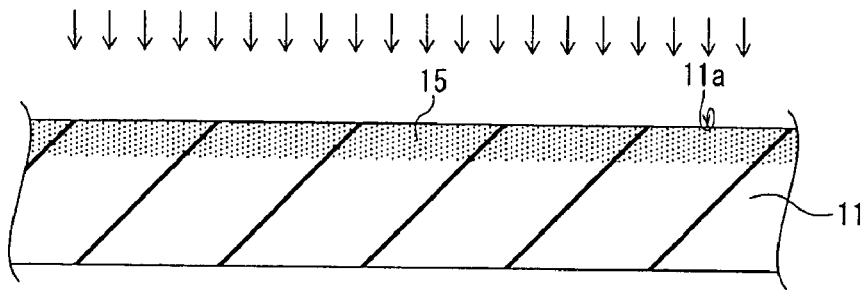
FIG. 4A is a cross-sectional view showing the semiconductor device in a first step of the first and second embodiments of the present invention taken along a I-I line of FIG. 3.
Figure 4B:
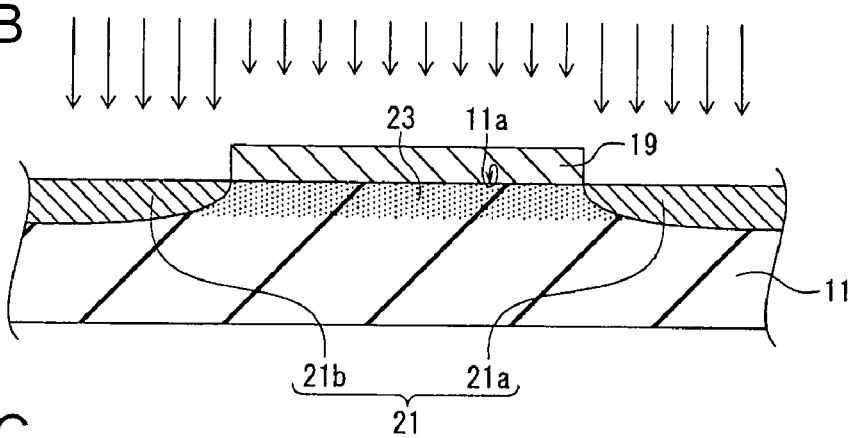
FIG. 4B is a cross-sectional view showing the semiconductor device in a second step of the first embodiment.
Figure 4C:
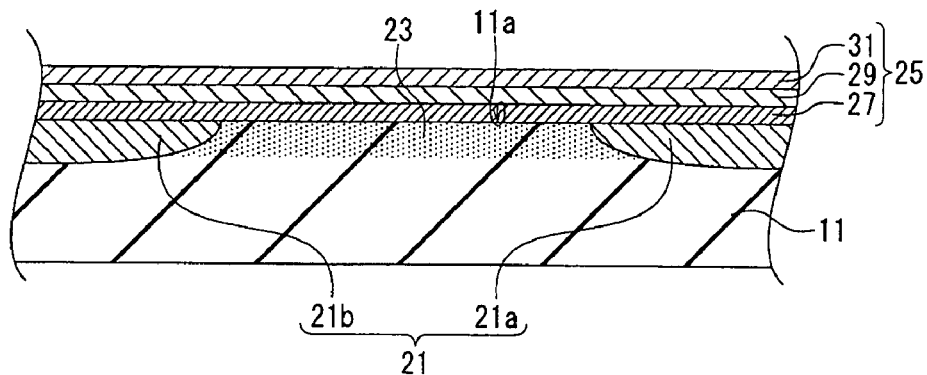
FIG. 4C is a cross-sectional view showing the semiconductor device in a third step of the first embodiment.
Figure 4D:
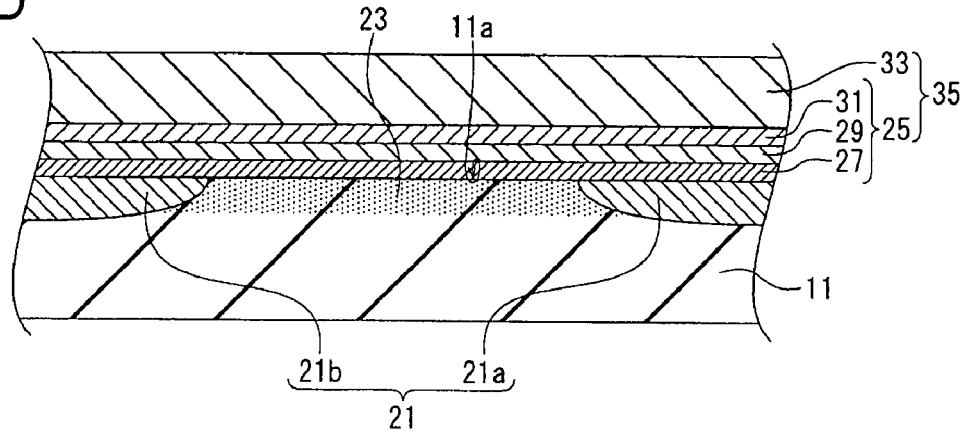
FIG. 4D is a cross-sectional view of the semiconductor device in a fourth step of the first embodiment.

FIG. 4A is a cross-sectional view showing the semiconductor device in a first step of the first embodiment taken along the I-I line of FIG. 3. The I-I line of FIG. 3 cuts out one portion of the element region 13 sandwiched by two adjacent element isolation regions 17. FIGS. 4B to 4D are cross-sectional views showing the semiconductor device in further steps of the first embodiment, which are taken along lines corresponding to the I-I line of FIG. 3. FIG. 6A is a cross-sectional view of the semiconductor device in a fifth step of the first embodiment taken along the II-II line of FIG. 5.

Figure 5:
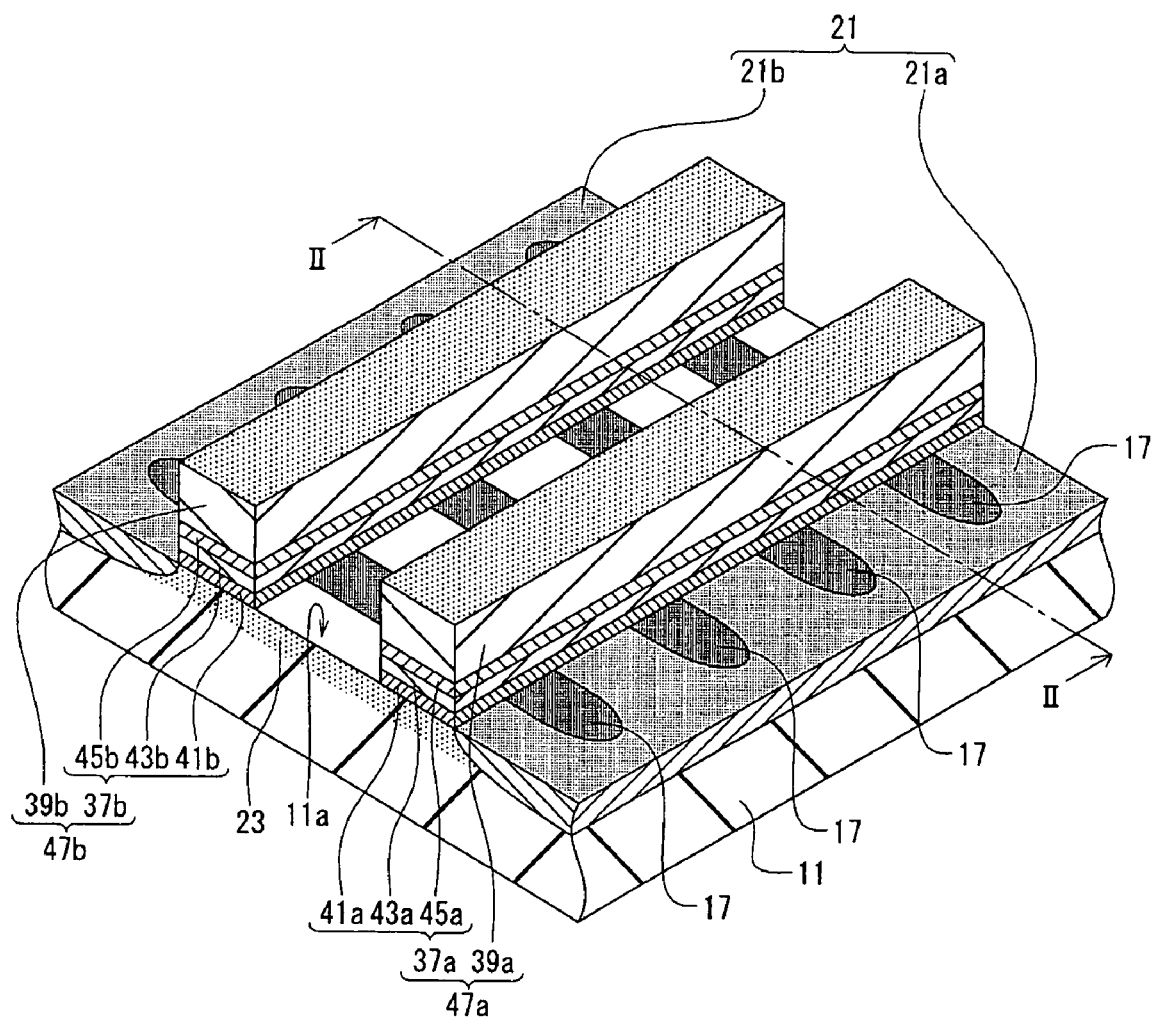
FIG. 5 is a perspective view showing the semiconductor device in a fifth step of the first embodiment and in a seventh step of the second embodiment.
Figure 6A:
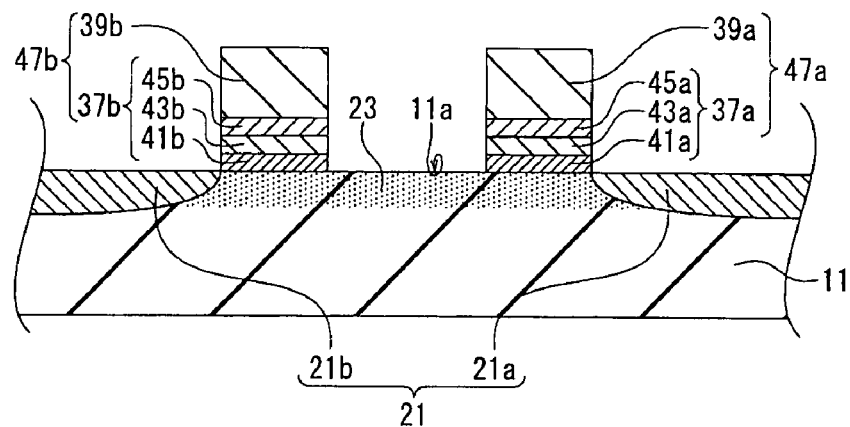
FIG. 6A is a cross-sectional view of the semiconductor device in a fifth step of the first embodiment taken along a II-II line of FIG. 5.
Figure 7:
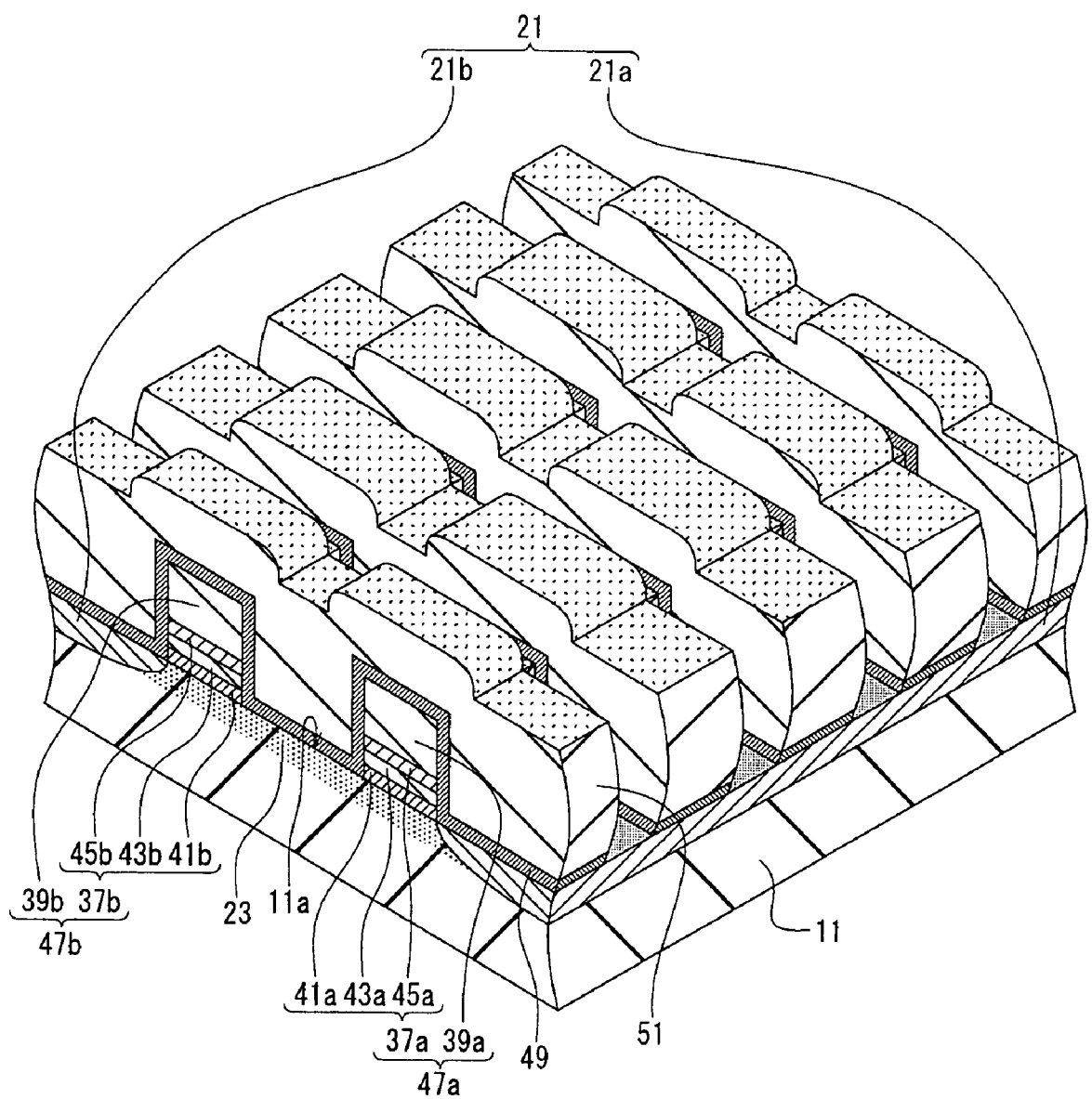
FIG. 7 is a perspective view showing the semiconductor device in an eighth step of the first embodiment and in a tenth step of the second embodiment.

FIG. 5 is a perspective view showing the semiconductor device in a fifth step of the first embodiment. FIG. 7 is a perspective view showing the semiconductor device in an eighth step of the first embodiment.

In a first step, a first conductive type impurity region 15 is formed in the element region 13 of the semiconductor substrate 11 by doping impurities of a first conductive type into the element region 13 of the semiconductor substrate 11 as shown in FIG. 4A.

As described above, the element region 13 is formed in the semiconductor substrate 11 so that the upper surface thereof exposes from the plurality of element isolation regions 17. By doping impurities of the first conductive type into the element region 13 of the semiconductor substrate 11, the element region 13 is partially changed into the first conductive type impurity region 15 serving as an impurity diffusion region having a conductive type. The first conductive type impurity doping in the first step is performed with the aim of controlling a threshold value of a channel region which will be formed in a later step. The impurities of the first conductive type are doped by means of a conventional implantation technology such as an S/D implantation method. If a transistor structure having p-type conductivity is formed on the semiconductor substrate 11, n-type impurities such as As (arsenic) and P (phosphorus) are doped into the semiconductor substrate 11 in the first step. On the other hand, if a transistor structure having n-type conductivity is formed on the semiconductor substrate 11, p-type impurities such as Ga (gallium) and In (indium) are doped into the semiconductor substrate 11 in the first step. Suitable impurities may be appropriately doped on the ground of a design of a given transistor structure.

In the first step, before doping the impurities of the first conductive type, a damage prevention film (not shown) to prevent damages to the semiconductor substrate due to the impurity doping may be formed on an upper surface of the semiconductor substrate 11. The damage prevention film, which is formed from, for instance, a silicon oxide film, is formed by means of a conventional method such as a thermal oxidation method, a chemical vapor deposition method, and other suitable methods.

In a second step, a mask 19 is formed on an upper surface of the first conductive type impurity region 15 into which a channel region will be formed. And then, impurities of a second conductive type, whose conductivity is opposite to that of the first conductive type, are doped into the first conductive type impurity region 15, so that separate first and second main electrode regions 21a and 21b (a main electrode region 21) are formed in the semiconductor substrate 11. In addition, a channel region 23 sandwiched by the first and second main electrode regions 21a and 21b is formed in the semiconductor substrate 11 under the mask 19. The channel region 23, into which the impurities of the second conductive type are not doped, has the first conductivity type.

The mask 19 is formed in the following way. A resist layer is deposited by means of a conventional photoresist technique. By patterning the resist layer by a conventional method such as a photolithographic etching technique, a dry etching technique, and other suitable techniques, the mask 19 is formed as shown in FIG. 4B.

After the formation of the mask 19, the channel region 23 and the first and second main electrode regions 21a and 21b separated from each other by the channel region 23 are formed. The first and second main electrode regions 21a and 21b correspond to a source and drain of the transistor.

The impurities of the second conductive type having a conductivity opposite to the first conductive type are doped into the first conductive type impurity region 15. At the time of doping the impurities having the second conductive type, the channel region 23 is masked by the mask 19 formed thereon, so that the impurities having the second conductive type are not doped into the channel region 23. Therefore, the first conductive type impurity region 15 under the mask 19, into which the impurities of the second conductive type are not doped, has the first conductive type. The first conductive type impurity region 15, into which the impurities of the second conductive type are not doped, corresponds to the channel region 23. On the other hand, the first conductive type impurity region 15, into which the impurities of the second conductive type are doped, is changed as the first and second main electrode regions 21a and 21b so as to sandwich the channel region 23.

In the second step, the impurities of the second conductive type are doped by use of a conventional method such as an S/D implantation technique. One of the first and second main electrode regions 21a and 21b serves as a source region of the transistor and the other serves as a drain region.

In the second step, if a transistor structure having p-type conductivity is formed on the semiconductor substrate 11, p-type impurities such as Ga (gallium) and In (indium) are doped into the semiconductor substrate 11 in the second step. On the other hand, if a transistor having n-type conductivity is formed on the semiconductor substrate 11, n-type impurities such as As (arsenic) and P (phosphorus) are doped into the semiconductor substrate 11 in the second step. Suitable impurities may be appropriately doped on the ground of a design of a given transistor.

In a third step, the mask 19 is removed and then an ONO film 25 is formed on the upper surface of the semiconductor substrate 11 as shown in FIG. 4C.

In the third step, the mask 19 is firstly removed. If the damage prevention film for preventing damages to the semiconductor substrate 11 due to the impurity doping is formed on the upper surface of the semiconductor substrate 11 in the first step, the damage prevention film is also removed after or at the same time of removing the mask 19. The mask 19 and the damage prevention film are removed by means of a conventional method for such as an etching back method, a CMP method, and other suitable methods. A suitable method may be appropriately chosen for a design of a given semiconductor device.

After removing the mask 19, the ONO film 25 is formed by depositing a lower oxide film 27, a charge storage nitride film 29, and an upper oxide film 31 in sequence on the upper surface of the semiconductor substrate 11.

The lower oxide film 27 formed from a silicon oxide film is firstly formed on the upper surface of the semiconductor substrate 11. The lower oxide film 27 serves as a buffer layer, for absorbing a stress difference between the semiconductor substrate 11 and the charge storage nitride film 29 formed thereon and adjusting a thickness of the ONO film 25. Thus, it is preferable that a thickness of the lower oxide film 27 is 40 Å at a minimum. If such effects are allowed that the lower oxide film 27 absorbs the stress difference between the semiconductor substrate 11 and the charge storage nitride film 29 and adjusts the thickness of the ONO film 25, the lower oxide film 27 may has a thickness of approximately 40 Å at a minimum. Thus, the thickness of the lower oxide film 27 is not limited to 40 Å at a minimum. The lower oxide film 27 is formed by means of a conventional method such as a thermal oxidation method, a chemical vapor deposition method, and other methods.

The charge storage nitride film 29 formed from a silicon nitride film is formed on the upper surface of the lower oxide film 27. In a later step, the charge storage nitride film 29 is partially removed excluding two portions thereof which are located above both end portions of the channel region 23. The two portions of the charge storage nitride film 29 which are not removed respectively correspond to first and second charge storage nitride films. In the semiconductor device manufactured by the first embodiment of the present invention, the first and second charge storage nitride films respectively serving as a memory functional body can accumulate electrons injected thereinto in a writing operation and store electric charges. Thus, it is preferable that a thickness of the charge storage nitride film 29 is in a range of 40 Å to 100 Å. If such effects that the charge storage nitride film 29 accumulates electrons injected thereinto and retains electric charges are allowed, the charge storage nitride film 29 may have a thickness in the range of approximately 40 to 100 Å. Thus, the thickness of the lower oxide film 27 is not limited to the range. The charge storage nitride film 29 is formed by means of a conventional method such as a chemical vapor deposition and other suitable methods.

The upper oxide film 31 formed from a silicon oxide film is formed over an upper surface of the charge storage nitride film 29. The upper oxide film 31 is formed as a buffer layer, for absorbing a stress difference between the charge storage nitride film 29 positioned thereunder and first and second floating gates formed thereon and adjusting the thickness of the ONO film 25. Thus, it is preferable that a thickness of the upper oxide film 31 is 40 Å at a minimum. If such effects that the upper oxide film 31 absorbs the stress difference between the charge storage nitride film 29 positioned thereunder and first and second floating gates formed thereon and adjusts the thickness of the ONO film 25 are allowed, the upper oxide film 31 may has a thickness of approximately 40 Å at a minimum. Thus, the thickness of the lower oxide film 27 is not limited to 40 Å at a minimum. The upper oxide film 31 is formed by means of a conventional method such as a chemical vapor deposition.

The ONO film 25 is configured by the lower oxide film 27, the charge storage nitride film 29, and the upper oxide film 31.

In a fourth step, a floating gate material layer 33 is formed over an upper surface of the ONO film 25 as shown in FIG. 4D.

The floating gate material layer 33 is formed by depositing a polysilicon on the upper surface of the ONO film 25 by means of a conventional method such as a chemical vapor deposition method. Hereinafter, a layered product including the ONO film 25 and the floating gate material layer 33 is referred as a layered product 35 as denoted in FIG. 4D.

In a fifth step, the layered product 35 is partially etched away so that the upper surface 11a of the semiconductor substrate 11 is partially exposed. By etching such the way, separate first and second remnant regions 47a and 47b are formed on the channel region 23. The first and second remnant regions 47a and 47b, which are substantially parallel to each other, extend in a direction substantially perpendicular to the longitudinal direction of the element isolation region 17. As shown in FIG. 5, the first and second remnant regions 47a and 47b have a stripe geometry with longitudinal direction thereof aligned vertically with respect to the longitudinal direction of the element isolation region 17. By partially removing the ONO film 25 and the floating gate material layer 33, the first and second remnant regions 47a and 47b respectively including first and second ONO films 37a and 37b and first and second floating gates 39a and 39b are formed as shown in FIG. 6A. The first and second ONO films 37a and 37b respectively correspond to remnant films of the ONO film 25. The first and second floating gates 39a and 39b respectively correspond to remnant layers of the floating gate material layer 33. It is to be noted that FIG. 6A is a cross-sectional view taken along the II-II line of FIG. 5.

In the fifth step, the partial removal of the layered product 35 is performed by means of a conventional photolithographic method. The remnant films of the ONO film 25, which are not removed away, respectively correspond to the first and second ONO films 37a and 37b which are separated from each other as shown in FIG. 6A. The remnant layers of the floating gate material layer 33, which are not removed away, respectively correspond to the first and second floating gates 39a and 39b which are separated from each other. Hereinafter, separate remnant films of the lower oxide film 27, the charge storage nitride film 29, and the upper oxide film 31, which are not removed, are respectively referred to as first and second lower oxide films 41a and 41b, first and second charge storage nitride films 43a and 43b, and first and second upper oxide films 45a and 45b as denoted in FIG. 5A. In addition, separate layered products configured by the first and second ONO films 37a, 37b and the first and second floating gates 39a, 39b are referred to as first and second remnant regions 47a and 47b, respectively.

The upper surface of the channel region 23 is partially exposed between the first and second remnant regions 47a and 47b separated from each other. An exposed portion of the upper surface of the channel region 23 is filled with a control gate via an interlayer insulating film in a later step. By applying a voltage across the control gate and either one of the first and second electrode regions, the voltage is applied to the channel region 23 as a bias voltage. Thus, for the purpose of sufficiently applying the bias voltage to the channel region 23 by the applied voltage across the control gate and either one of the first and second electrode regions, it is preferable that the layered product 35 is removed away in the fifth step so that a distance between the first and second remnant regions 47a and 47b is 1500 Å at a minimum. It is to be noted that the distance between the first and second remnant regions 47a and 47b corresponds to a channel length of the exposed portion of the channel region 23. If such the effect is allowed that the bias voltage is sufficiently applied to the channel region 23, it may be configured that the distance between the first and second remnant regions 47a and 47b is approximately 1500 Å at a minimum. Thus, the distance between the first and second remnant regions 47a and 47b is not limited to 1500 Å at a minimum.

Upper surfaces of and both side surfaces of the first and second floating gates 39a and 39b formed in the fifth step are covered with a control gate which will be in a later step. In response to an applied voltage across the control gate and either one of the first and second electrode regions 21a, 21b, a voltage is induced on the first and second floating gates 39a and 39b. The induced voltage on first and second floating gates 39a and 39b causes an electron injection into either one of the first and second charge storage nitride films 43a and 43b of the first and second ONO films 37a and 37b. For the purpose of the electron injection into either one of the first and second charge storage nitride films 43a and 43b owing to the induced voltage on the first and second floating gates 39a and 39b, it is preferable that the layered product 35 is removed in the fifth step so that the first and second floating gates 39a and 39b have a thickness in a range of 100 to 1000 Å. If such the effect is allowed that the electrons are injected into either one of first and second charge storage nitride films 43a and 43b owing to the induced voltage on the first and second floating gates 39a and 39b, it may be configured that the first and second floating gates 39a and 39b have a thickness in a range of approximately 100 to 1000 Å. Thus, the thicknesses of the first and second floating gates 39a and 39b are not limited to in the range of approximately 100 to 1000 Å.

Figure 6B:
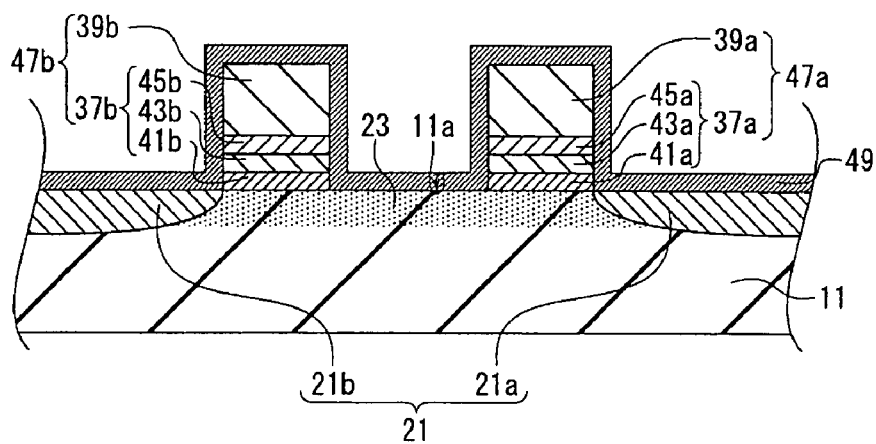
FIG. 6B is a cross-sectional view showing the semiconductor device in the sixth step of the first embodiment and the eighth step of the second embodiment.

In a sixth step, an interlayer insulating film 49 is formed so as to entirely cover over the upper surface of the semiconductor substrate 11 and the first and second remnant regions 47a and 47b as shown in FIG. 6B.

The interlayer insulating film 49 formed from an oxide film is formed by means of a conventional method such as a thermal oxidation method or a CVD method. In the case of the distance of 1500 Å between the first and second remnant regions 47a and 47b, it is preferable that the interlayer insulating film 49 has a thickness of 10 to 100 Å. Even if the formed interlayer insulating film 49 has, for example, the maximum thickness of 100 Å, it is configured that the distance between the first and second remnant regions 47a and 47b is fifteen times as long as the thickness of the interlayer insulating film 49. Thus, a space between the first and second remnant regions 47a and 47b is not completely filled with the interlayer insulating film 49 having a uniform thickness.

Figure 6C:
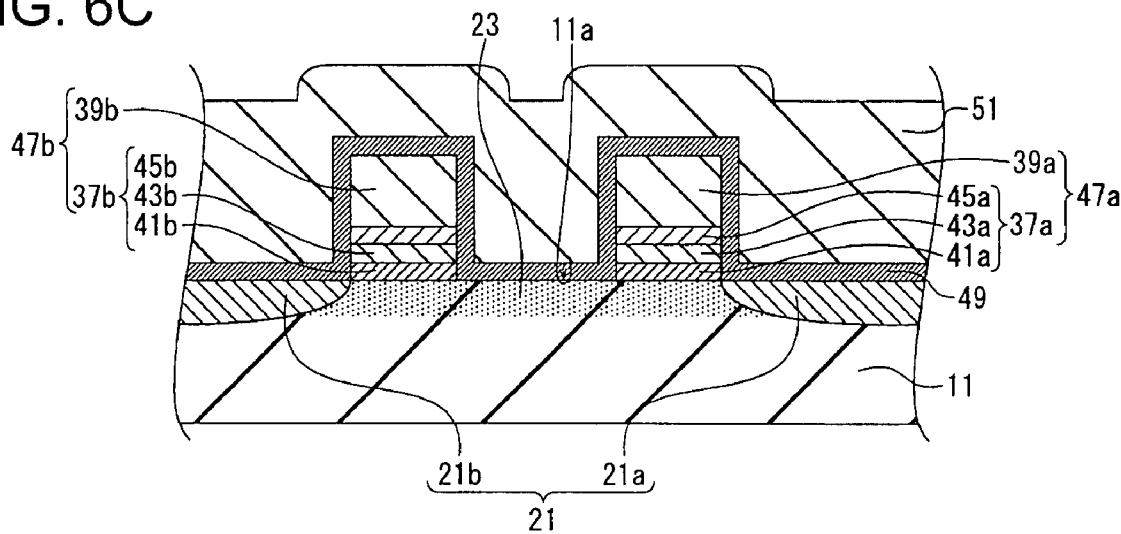
FIG. 6C is a cross-sectional view showing the semiconductor device in a seventh step of the first embodiment and in a ninth step of the second embodiment.

In a seventh step, a control gate 51 is formed so as to completely fill the space between the first and second remnant regions 47a and 47b therewith and cover over the interlayer insulating film 49 therewith as shown in FIG. 6C.

The control gate 51 is formed by depositing a polysilicon on an upper surface of the interlayer insulating film 49 by means of a conventional method such as a chemical vapor deposition etc. The control gate 51 is formed so as to completely fill the space between the first and second remnant regions 47a and 47b, thus having a thickness thicker than that of the first and second remnant regions 47a and 47b. Thus, in the case that the first and second floating gates have a thickness of 100 Å and the first and second ONO films 37a and 37b have a thickness of 80 Å, it is preferable that the control gate 51 has a thickness of 1200 Å at a minimum. If such the effect that the space between the first and second remnant regions 47a and 47b is completely filled with the control gate 51 is allowed, it may be configured that the control gate 51 have a thickness of approximately 1200 Å at a minimum. Thus, the thickness of the control gate 51 is not limited to 1200 Å at a minimum.

In a eighth step, the control gate 51, the interlayer insulating film 49, the first and second floating gates 39a, 39b, and the first and second ONO films 37a and 37b, which are located on/above the upper surfaces of the plurality of the element isolation regions 17 and upper surfaces of portions of the element region 13 sandwiching the element isolation regions 17 in the longitudinal direction of the element isolation regions 17, are removed so that the semiconductor device as show in FIG. 7 is formed.

The partial removals of the control gate 51, the interlayer insulating film 41, the first and second floating gates 39a, 39b, and the first and second ONO films 37a and 37b are performed by means of a conventional photolithographic method. A cross-sectional side view of the structural body formed in the eighth step taken along a line corresponding to the I-I line of FIG. 3 or the II-II line of FIG. 5 is similar to FIG. 6, and thus is not shown.

Writing operations of the semiconductor device manufactured by the first embodiment of the present invention is performed in the following way. A voltage is firstly applied across the control gate 51 and either one of the first or second main electrode regions 21a, 21b, thus increasing electric potentials at the first or the second floating gates 39a, 39b covered with the control gate 51 via the interlayer insulating film 49. Under the applied voltage, electrons transfer from one of the first and second main electrode regions 21a and 21b, to which the voltage is not applied, toward the other to which the voltage is applied. In other words, the electrons transfer from a source to a drain of the transistor. The electrons are attracted toward the first and second floating gates 39a, 39b at which the electric potentials are increased. Thus, the electrons transferring from the source region to the drain region are partially trapped into either one of the first or second charge storage nitride films 43a, 43b which are close to the source region. In such the way, the writing operation for one of the first and second charge storage nitride films 43a, 43b is completed. On the other hand, a writing operation for the other of the first and second charge storage nitride films 43a, 43b is similarly performed so that a voltage on one of the first and second main electrode regions 21a, 21b is applied oppositely in the case of the above-described writing operation. In other words, a voltage is applied to the source.

The semiconductor device manufactured by the first embodiment of the present invention includes the first and second floating gates 39a and 39b formed above the channel region 23. The semiconductor device also includes the control gate 51, with which the space between the first and second floating gates 39a and 39b are completely filled and the first and second floating gates 39a and 39b are covered via the interlayer insulating film 49.

In the semiconductor device manufactured by the first embodiment of the present invention, the upper surfaces of the first and second floating gate 39a, 39b face to the control gate 51 via the interlayer insulating film 49. In addition, both side surfaces of each the first and second floating gate 39a, 39b face to the control gate 51 via the interlayer insulating film 49. Thus, the semiconductor device manufactured by the first embodiment can increase surface areas of the floating gates 39a, 39b facing to the control gate 51 in comparison with the conventional semiconductor device of the document D1 where only one surface of the floating gate faces to the control gate.

The semiconductor device manufactured by the first embodiment of the present invention includes the first and second ONO films 37a and 37b respectively having the first and second charge storage nitride films 43a and 43b, both of which respectively operate as memory functional bodies. The first and second ONO films 37a and 37b are formed under the first and second floating gates 39a and 39b, respectively. Only the interlayer insulating film 49 is formed between the first and second floating gates 39a, 39b and the control gate 51. Thus, according to the semiconductor device manufactured by the first embodiment, a thickness of the insulating film formed between the floating gates and the control gate can be decreased in comparison with the conventional semiconductor device of the document D1 where the ONO film composed of the three films is formed between the floating gates and the control gate.

According to the semiconductor device manufactured by the first embodiment, surface areas of the first and second floating gates 39a, 39b facing to the control gate 51 can be relatively increased. In addition, the thickness of the insulating film formed between the first and second floating gates 39a, 39b and the control gate 51 can be decreased. The voltage induced on the first and second floating gates 39a, 39b can be increased in comparison with the conventional semiconductor device of the document D1. It is therefore that electrons are prone to be injected into the first and second charge storage nitride films 43a, 43b respectively serving as memory functional bodies, so that the semiconductor device manufactured by means of the first embodiment can improve such the problem that writing errors occur in a writing operation, thereby decrease in reliability of the device.

In the semiconductor device manufactured by the first embodiment, electrons are injected into the first and second charge storage nitride films 43a, 43b. In other words, a writing operation is performed by inducing a writing voltage on the first and second floating gates 39a and 39b. The induced writing voltage is controlled so that electrons are not injected into an unintended memory cell, which is different from the conventional semiconductor device of the document D2-1 where a writing operation is performed by applying a writing voltage directly on the control gate.

In the semiconductor device manufactured by the first embodiment, the first and second ONO films 37a, 37b respectively including the first and second charge storage nitride films 43a, 43b are only formed below the first and second floating gates 39a, 39b, respectively. The first and second charge storage nitride films 43a, 43b respectively operate as memory functional bodies. In addition, the first and second floating gates 39a, 39b and the first and second ONO films 37a, 37b are covered with the interlayer insulating film 49. The control gate 51 does not directly contact to the first and second ONO films 37a, 37b. An electric field of the control gate 51, which generates during a reading operation for the first and second charge storage nitride films 43a and 43b, is not directly impressed into the first and second charge storage nitride films 43a and 43b since the electric field of the control gate 51 is absorbed by the first and second floating gates 39a, 39b and the interlayer insulating film 49. Accordingly, the semiconductor device manufactured by means of the first embodiment can prevent loss of the electrons respectively retained in the first and second charge storage nitride films 43a and 43b even in the case that reading operations are repeatedly performed in the similar way of the conventional semiconductor device of the document D2-1.

In the semiconductor device manufactured by the first embodiment, the upper surface of the channel region 23 between the first and second floating gates 39a and 39b faces to the control gate 51, with which the space between the first and second floating gates 39a, 39b is covered, via the interlayer insulating film 49. A bias voltage can be easily applied to the channel region 23 by applying a voltage across the control gate 51 and the first and second electrode regions 21a, 21b. Therefore, the semiconductor device manufactured by the first embodiment can increase a driving ability thereof in comparison with the conventional semiconductor device of the document D2-2 where the insulating film, the floating gate, and the ONO film are formed between the channel region and the control gate of the substrate.

SECOND EMBODIMENT

A second embodiment of the method of manufacturing the semiconductor device according to the present invention will now be described. A semiconductor device manufactured by the second embodiment is configured by a transistor structure including a channel region, separate first and second floating gates which are formed on the channel region, and a control gate formed so as to cover the first and second floating gates. The second embodiment includes the following first to tenth steps. Each of the steps is described in sequence.

The second embodiment is different from the first embodiment in the point that a gate formation sacrificial film is utilized for forming first and second floating gates. Elements in the second embodiment which operate in the same manner as those in the first embodiment are denoted by the same reference numerals and are not described in detail.

A first step of the second embodiment, in which impurities having a first conductive type are doped into a semiconductor substrate, is similar to the first step of the first embodiment in which the impurities having the first conductive type are doped into the semiconductor substrate. The semiconductor substrate in the first step of the second embodiment is also similar to that of the first embodiment. Thus, the first step of the second embodiment is referred to FIG. 4A and a detailed description of the first step of the second embodiment is omitted. In addition, eighth to tenth steps of the second embodiment are respectively similar to the sixth to eighth steps of the first embodiment. Thus, the eighth to tenth steps of the second embodiment are referred to FIGS. 6A to 6B and a detailed description of these steps of the second embodiment is omitted.

Figure 8A:
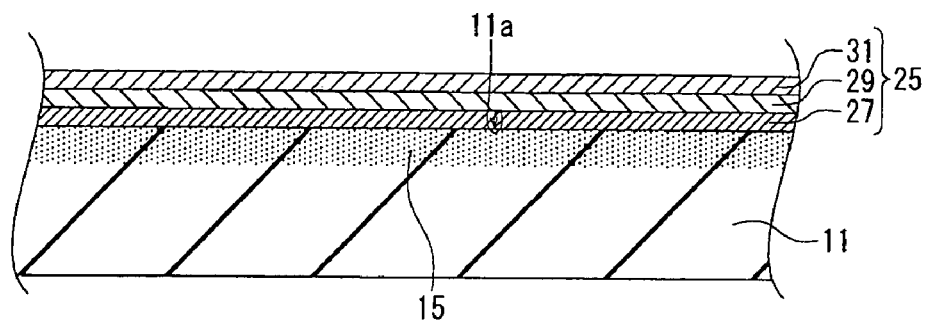
FIG. 8A is a cross-sectional view showing the semiconductor device in a second step of the second embodiment.
Figure 8B:
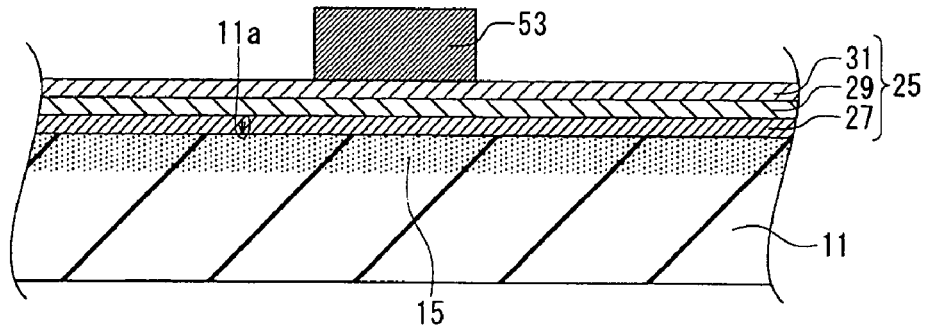
FIG. 8B is a cross-sectional view showing the semiconductor device in the third step of the second embodiment.

FIG. 4A is a cross-sectional view showing the semiconductor device in an initial step of the second embodiment of the present invention. FIGS. 8A to 8B are cross-sectional views showing the semiconductor device in further steps of the second embodiment of the present invention taken along lines corresponding to the I-I line of FIG. 3. FIGS. 9A to 9D are cross-sectional views of the semiconductor device in further steps of the second embodiment taken along lines corresponding to the I-I line of FIG. 5.

In a first step of the second embodiment, the first step of the first embodiment is similarly performed (refer to FIG. 4A).

In a second step, an ONO film 25 is formed on an upper surface of a semiconductor substrate 11 as shown in FIG. 8A. If a damage prevention film (not shown) for preventing damages caused by the impurities having the first conductive type is formed on the upper surface of the semiconductor substrate 11 in the first step, the damage prevention film is removed before forming the ONO film 25. The damage prevention film is removed by means of a conventional method such as an etching back method, a CMP method, and other methods.

In the same way as the first embodiment of the present invention, the ONO film 25 is formed by depositing a lower oxide film 27, a charge storage nitride film 29, and an upper oxide film 31 in sequence.

The lower oxide film 27 formed from a silicon oxide is firstly formed on the upper surface of the semiconductor substrate 11. The lower oxide film 27 is formed as a buffer for the purpose of absorbing a stress difference between the semiconductor substrate 11 and the charge storage nitride film 29 formed thereon and adjusting a thickness of the ONO film 25. For these purposes, it is therefore preferable that a thickness of the lower oxide film 27 is 10 Å at a minimum. However, if such the effects that the lower oxide film 27 absorbs the stress difference between the semiconductor substrate 11 and the charge storage nitride film 29 formed thereon and adjusts the thickness of the ONO film 25 are allowed, the lower oxide film 27 may have a thickness approximately 10 Å at a minimum. Thus, the thickness of the ONO film 25 is not limited to 10 Å at a minimum.

The charge storage nitride film 29 formed from a silicon nitride film is formed on an upper surface of the lower oxide film 27. In a later step, the charge storage nitride film 29 is partially removed excluding two portions thereof formed above both end portions of the channel region 23. The two portions of the charge storage nitride film 29 not removed correspond to first and second charge storage nitride films, respectively. In the semiconductor device manufactured by the second embodiment, each of the first and second charge storage nitride films operates as a memory functional body, thus accumulating electrons injected during a writing operation and retaining electric charges. It is therefore preferable that a thickness of the charge storage nitride film 29 is in a range of 10 to 100 Å. However, if such the effects that the charge storage nitride film 29 accumulates the injected electrons and retains the electric charge are allowed, the charge storage nitride film 29 may have a thickness in a range approximately 10 to 100 Å. Thus, the thickness of the charge storage nitride film 29 is not limited to the range of 10 to 100 Å. The charge storage nitride film 29 is formed by using a conventional chemical vapor deposition.

The upper oxide film 31 formed from a silicon oxide is formed on an upper surface of the charge storage nitride film 29. The upper oxide film 31 is formed as a buffer layer so as to absorb a stress difference between the charge storage nitride film 29 formed thereunder and first and second floating gates formed thereon and adjust a thickness of the ONO film 25. It is therefore preferable that a thickness of the upper oxide film 31 is 10 Å at a minimum. If such effects that the upper oxide film 31 absorbs the stress difference between the charge storage nitride film 29 and the first and second floating gates and adjusts the thickness of the ONO film 25 are allowed, the upper oxide film 31 may has a thickness of approximately 10 Å at a minimum. Thus, the thickness of the charge storage nitride film 29 is not limited to 10 Å at a minimum. The upper oxide film 31 is formed by means of a conventional method such as a chemical vapor deposition etc. The ONO film 25 is configured by the lower oxide film 27, the charge storage nitride film 29, and the upper oxide film 31.

In a third step, a gate formation sacrificial film 53 is formed on an upper surface of the ONO film 25 as shown in FIG. 8B.

The gate formation sacrificial film 53 is formed so as to adjust a thickness of first and second floating gates and a distance between the first and second floating gates. The first and second floating gates will be formed in a later step. In a subsequent step, a floating gate material layer will be formed on the upper surface of the semiconductor substrate 11 so as to cover the gate formation sacrificial film 53. In a further subsequent step, by removing the floating gate material layer, the first and second floating gates will be formed. The gate formation sacrificial film 53 serves as an etching stopper. Therefore, a thickness of the gate formation sacrificial film 53 formed in the third step corresponds to a thickness of the first and second floating gates. If the first and second floating gates having, for instance, a thickness of 1000 Å are formed, the gate formation sacrificial film 53 has also a thickness of 1000 Å.

The gate formation sacrificial film 53 will be removed in a later step after forming the first and second floating gates. Thus a length of the gate formation sacrificial film 53 formed in the third step corresponds to the distance between the first and second floating gates. After removing the gate formation sacrificial film 53, the ONO film 25 formed under the gate formation sacrificial film 53 is removed so that the upper surface of the semiconductor substrate 11 is partially exposed. An upper surface of a channel region of the semiconductor substrate 11 is partially exposed. Thus, the length of gate formation sacrificial film 53 in a direction parallel to a longitudinal direction of the element isolation region 13 corresponds to a channel length of the channel region whose upper surface is exposed.

In the same way as the writing operation of the semiconductor device manufactured by the first embodiment, by applying a voltage to a control gate which will be formed in a later step, a bias voltage is applied to the channel region 23. It is therefore preferable that the channel region whose upper surface is exposed has a channel length of 1500 Å at a minimum. It is also preferable that a length of the gate formation sacrificial film 53 formed in the third step is 1500 Å at a minimum. However, if such the effect that the bias voltage is sufficiently applied to the channel region in response to the applied voltage on the control gate is allowed, the gate formation sacrificial film 53 may has a thickness of approximately 10 Å at a minimum. Thus, the thickness of the gate formation sacrificial film 53 is not limited to 10 Å at a minimum.

The gate formation sacrificial film 53 is formed on the upper surface of the ONO film 25 by depositing, for example, a silicon nitride film by means of a conventional method such as a chemical vapor deposition, and then patterned by means of a well-known photolithographic technique.

Figure 9A:
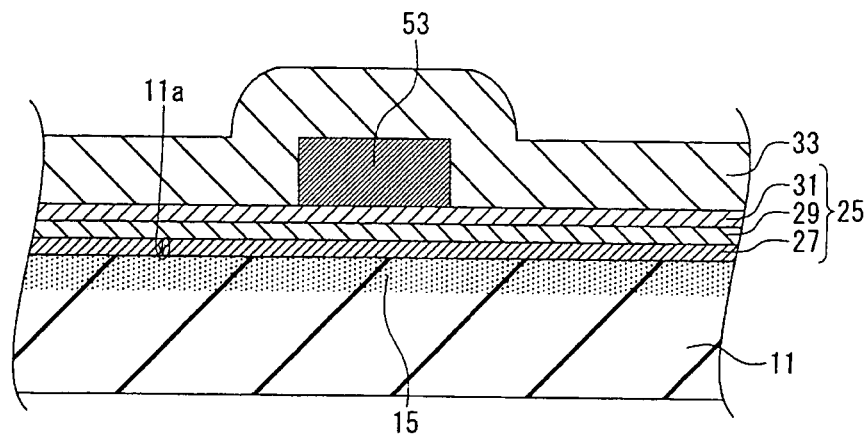
FIG. 9A is a cross-sectional view of the semiconductor device in a fourth step of the second embodiment.

In a fourth step, a floating gate material layer 33 is formed so as to cover the gate formation sacrificial film 53 and the upper surface of the ONO film 25 as shown in FIG. 9A.

The floating gate material layer 33 is formed by depositing a polysilicon on the upper surface of the ONO film 25 by means of a well-known technology such as a chemical vapor deposition etc.

Figure 9B:
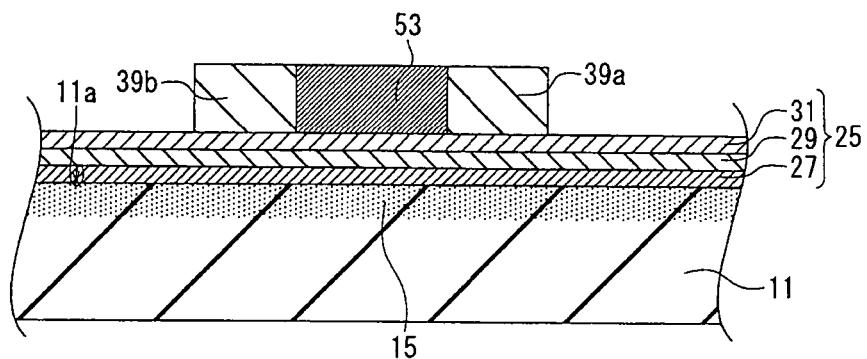
FIG. 9B is a cross-sectional view of the semiconductor device in a fifth step of the second embodiment.

In a fifth step, the floating gate material layer 33 is partially removed as shown in FIG. 9B. Remnant portions of the floating gate material layer 33, which are not removed, correspond to the first and second floating gates 39*a* and 39*b*, respectively. The first and second floating gates 39*a* and 39*b* are formed so as to sandwich the gate formation sacrificial film 53.

The floating gate material layer 33 is partially removed by means of a conventional method. If the floating gate material layer 33 has, for example, a uniform thickness, the floating gate material layer 33 is etched away by vertically etching by means of an anisotropic dry etching technology so that the upper surface of the gate formation sacrificial film 53 is exposed. The formed floating gate material layer 33 has a uniform thickness, thus one portion of the floating gate material layer 33 formed on the upper surface of the gate formation sacrificial film 53 has the same thickness as the other portion of the floating gate material layer 33 formed on the upper surface of the ONO film 25 excluding peripheral portions of the floating gate material layer 33 sandwiching the gate formation sacrificial film 53. The one portion of the floating gate material layer 33 formed on the upper surface of the gate formation sacrificial film 53 is removed. The other portion of the floating gate material layer 33 formed on the upper surface of the ONO film 25 is also etched away excluding the peripheral portions of the floating gate material layer 33 sandwiching the gate formation sacrificial film 53. By removing the floating gate material layer 33 in such the way so that the upper surface of the gate formation sacrificial film 53 is exposed, the floating gate material layer 33 is partially left. Thus, the remnant portions of the floating gate material layer 33 having a side-wall structure, which are not removed, are formed so as to sandwich both side surfaces of the gate formation sacrificial film 53.

The floating gate material layer 33 is partially removed by means of another method. The floating gate material layer 33 is partially removed by means of a conventional dry etching method while utilizing the gate formation sacrificial film 53 as an etching stopper so that the upper surface of the gate formation sacrificial film 53 is exposed. And then, the floating gate material layer 33 is partially removed by means of a conventional photolithographic technique so that the floating gate material layer 33 formed at the periphery of the gate formation sacrificial film 53 is remained. Thus, the remnant portions of the floating gate material layer 33 formed on the ONO film 25 are formed so as to sandwich both the side surfaces of the gate formation sacrificial film 53. The ONO film 25 also serves as an etching stopper not to be removed, so that the upper surface thereof is exposed as shown in FIG. 9B.

The remnant portions of the floating gate material layer 33 correspond to the first and second floating gates 39a, 39b, respectively. The first and second floating gates 39a, 39b and the gate formation sacrificial film 53 will serve as a mask in a subsequent step so as to prevent the channel region formed therebelow from being doped by impurities of a second conductive type. Thus, the impurities of the second conductive type are not doped into a region of the semiconductor substrate 11 masked by the first and second floating gates 39a, 39b and the gate formation sacrificial film 53. The undoped region of the semiconductor substrate 11 formed below the first and second floating gates 39a, 39b and the gate formation sacrificial film 53, into which the impurities of the second conductive type are not doped, corresponds to the channel region of the semiconductor substrate 11. Thus, lengths of the remnant portions of the floating gate material layer 33 sandwiching the gate formation sacrificial film 53 is configured on the basis of a channel length of the channel region.

Figure 9C:
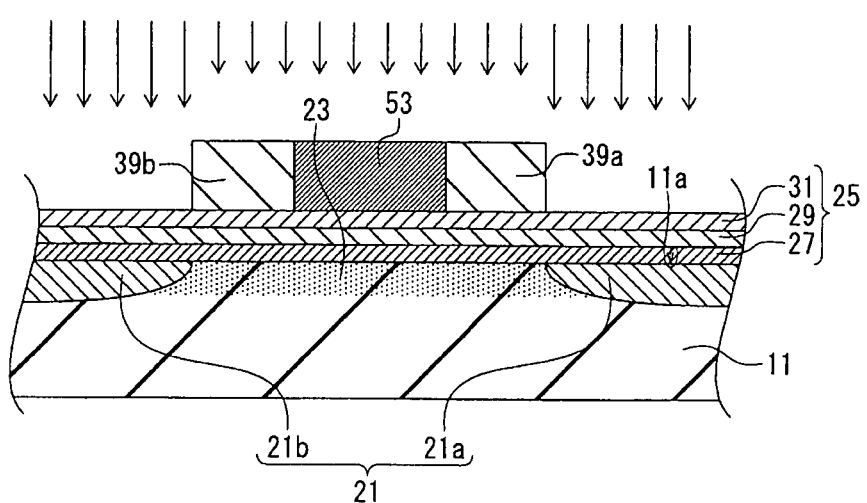
FIG. 9C is a cross-sectional view of the semiconductor device in a sixth step of the second embodiment.

In a sixth step, impurities of a second conductive type whose conductivity is opposite to the first conductive type are doped into the first conductive type impurity region 15 while utilizing the gate formation sacrificial film 53 and the first and second floating gates 39a,9b as a mask. Thus, first and second main electrode regions 21a and 21b are formed as shown in FIG. 9C. In addition, a channel region 23 is formed below the gate formation sacrificial film 53 and the first and second floating gates 39a, 39b and thus sandwiched by the first and second main electrode regions 21a and 21b. The channel region 23 is formed as a second conductive type impurity undoped region.

In the sixth step, a channel region 23 of the transistor is formed. In addition, the first and second main electrode regions 21a and 21b corresponding to source and drain regions of the transistor are formed.

The impurities of the second conductive type, whose conductivity is opposite to the first conductive type, are doped into the first conductive type impurity region 15. The impurities of the second conductive type are not doped into the channel region 23 since the channel region 23 is masked by the gate formation sacrificial film 53 and the first and second floating gates 39a, 39b. The impurities of the second conductive type are not doped into the first conductive type impurity region 15 formed below the gate formation sacrificial film 53 and the first and second floating gates 39a, 39b. The first conductive type impurity region 15, into which the impurities of the second conductive type are not doped, corresponds to the channel region 23. On the other hands, the first conductive type impurity region 15, into which the impurities of the second conductive type are doped, corresponds to the first and second main electrode regions 21a and 21b sandwiching the channel region 23.

At the time of the second conductive type impurity doping, the impurities are also doped into the first and second floating gates 39a, 39b utilized as the mask. Thus, the first and second floating gates 39a and 39b having the second conductivity type are increased in their conductivities.

The impurities of the second conductive type in the sixth step are doped by a conventional method such as an S/D implantation etc. One of the first and second main electrode regions 21a, 21b serves as a source of the transistor and the other serves as a drain transistor.

In the sixth step, if a transistor having p-type conductivity is formed in the semiconductor substrate 11, p-type impurities such as Ga (gallium) and In (indium) are doped into the semiconductor substrate 11. On the other hand, if a transistor having n-type conductivity is formed in the semiconductor substrate 11, n-type impurities such as As (arsenic) and P (phosphorus) are doped into the semiconductor substrate 11. Suitable impurities may be appropriately doped on the ground of a design of a given transistor.

Figure 9D:
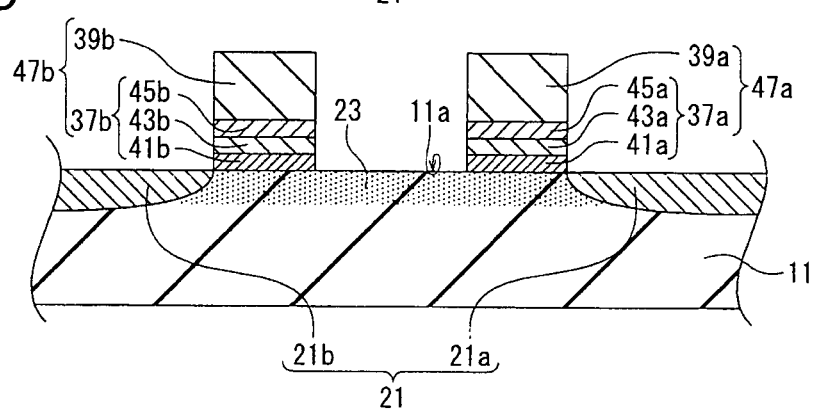
FIG. 9D is a cross-sectional view of the semiconductor device in a seventh step of the second embodiment taken along II-II line of FIG. 5.

In a seventh step, the gate formation sacrificial film 53 and the ONO film 25 are partially removed excluding portions respectively formed under the first and second floating gates 39a and 39b so that an upper surface 11a of the semiconductor substrate 11 is exposed as shown in FIG. 9D. Remnant portions of the ONO film 25 which are not removed correspond to first and second ONO films 37a and 37b, respectively.

In the seventh step, firstly, only the gate formation sacrificial film 53 is selectively removed. In the case that the gate formation sacrificial film 53 is formed from, for instance, a nitride film, the gate formation sacrificial film 53 is removed by a conventional wet etching. It is preferable in this case to remove the nitride film by utilizing $H_3PO_4$ (a thermal phosphoric acid) serving as an etchant. The gate formation sacrificial film 53 can be removed by a wet etching while using $H_3PO_4$ as an etchant so that the first and second floating gates 39a, 39b sandwiching the gate formation sacrificial film 53 are not removed. In this way, the upper surface of the ONO film 25, that is, the upper surface of the upper oxide film 31 is not removed.

The ONO film 25 is partially removed excluding portions thereof respectively formed under the first and second floating gates 39a and 39b so that the upper surface of the semiconductor substrate 11 is partially exposed. The ONO film 25 is partially removed by means of a conventional dry etching. It is preferable that a mixed gas of Ar, $C_4H_8$, and $O_2$ or a mixed gas of He, $C_5F_8$, and $O_2$ are utilized as an etchant. While utilizing these mixed gases, only the ONO film 25 can be selectively removed so that the first and second floating gates 39a, 39b are not removed. In the seventh step, the first and second floating gates 39a and 39b serves as a mask, an anisotropic dry etching using a mixed gas including Ar (argon), $C_4H_8$ (Butene-1), and $O_2$ (oxygen) or a mixed gas including He (helium), $C_5F_8$ (octafluorocyclopentene), and $O_2$ (oxygen) is vertically carried out on the ONO film 25. The ONO film 25 is partially etched away excluding portions thereof formed under the first and second floating gates 39a and 39b, thus forming remnant portions of the ONO film 25. The remnant portions of the ONO film 25 formed under the first and second floating gates 39a and 39b respectively correspond to first and second ONO films 37a and 37b.

As shown in FIG. 9D, the lower oxide film 27, the charge storage nitride film 29, and the upper oxide film 31 configuring the remnant portions of the ONO film 25 correspond to first and second lower oxide films 41a, 41b, first and second charge storage nitride films 43a, 43b, and first and second upper oxide film 45a, 45b, respectively.

Eighth to tenth steps of the second embodiment, which are respectively similar to the sixth to eighth steps of the first embodiment, are carried out (refer to FIGS. 6B, 6C, and 7).

In the third step of the second embodiment of the present invention, the gate formation sacrificial film 53, which is sandwiched by the first and the second floating gates 39a and 39b formed in the subsequent step, is formed on the upper surface of the ONO film 25. The floating gate material layer 33 covering over the gate formation sacrificial film 53 is partially removed so as to form the first and second floating gates 39a and 39b which are separated form each other. Subsequently, the gate formation sacrificial film 53 is selectively removed.

In the semiconductor device manufactured by the second embodiment, the first and second floating gates 39a and 39b are separated from each other by the gate formation sacrificial film 53. The length of the gate formation sacrificial film 53 is configured on the basis of gate lengths of the first and second floating gates 39a, 39b and a separate distance between the first and second floating gates 39a, 39b. Thus, the gate lengths and the separation distance of the first and second floating gates 39a, 39b are configured with accuracy. Therefore, the first and second floating gates 39a, 39b with more accuracy can be formed in accordance with their designs in comparison with the semiconductor device manufactured by means of the first embodiment of the present invention where the gate lengths and the separation length are configured at the time of removing the floating gate material layer 33. Even if miniaturization of the elements is accompanied by miniaturization of the semiconductor chip, a size of the gate formation sacrificial film 53 can be configured on the basis of a design of a given semiconductor device. Thus, the gate lengths of the first and second floating gates 39a and 39b and the separation distance therebetween can be configured with more accuracy.

Furthermore, in the second embodiment of the present invention, by utilizing the gate formation sacrificial film 53 and the first and second floating gates 39a, 39b as a mask, the first and second main electrode regions 21a and 21b sandwiching the channel region 23 are formed in the sixth step by doping the impurities of the second conductive type.

It is therefore that the method of the second embodiment can improve a manufacture throughput and reduce manufacturers' cost in comparison with the first embodiment where the mask 19 is not required for forming the channel region 23.

Furthermore, in the second embodiment of the present invention, the impurities of the second conductive type are doped while utilizing the gate formation sacrificial film 53 and the first and second floating gates 39a, 39b as a mask, thus forming the channel region 23 as a second conductive type impurity undoped region of the semiconductor substrate 11. The channel region 23 is masked by the gate formation sacrificial film 53 and the first and second floating gates 39a, 39b, so that the impurities of the second conductive type is not doped thereinto. The channel region 23 is formed after forming the first and second floating gates 39a and 39b. Therefore, the channel region 23 having a channel length with accuracy is formed in comparison with the first embodiment in which the first and second floating gates 39a and 39b are formed after forming the channel region 23.

This application is based on Japanese Patent Application No. 2006-142475 which is herein incorporated by reference.

What is claimed is:

1. A method of manufacturing a semiconductor device comprising:
    a first step of preparing a semiconductor substrate including a plurality of element isolation regions disposed at substantially equal intervals in a direction perpendicular to a longitudinal direction of said element isolation regions and an element region exposed from said plurality of element isolation regions and doping impurities of a first conductive type into said element region, and forming a first conductive type impurity region in said element region of said semiconductor substrate;
    a second step of forming a masking film on a portion of said first conductive type impurity region and then doping impurities of a second conductive type whose conductivity is oppose to that of said first conductive type into said first conductive type impurity region and forming a channel region having said first conductive type and first and second main electrode regions having said second conductive type, said first and second main electrode regions sandwiching a channel region;
    a third step of removing said masking film and then forming a lower oxide film, a charge storage nitride film, and an upper oxide film in sequence so as to cover over an upper surface of said semiconductor substrate, so as to form an ONO film including said lower oxide film, said charge storage nitride film, and said upper oxide film;
    a fourth step of forming a floating gate material layer on said ONO film, so as to form a layered product including said ONO film and said floating gate material layer;
    a fifth step of partially etching said layered product so as to form remnant portions of said layered product as first and second remnant regions separated from each other, said first and second remnant regions substantially parallel to each other extending in a direction perpendicular to said longitudinal direction of said plurality of element isolation regions, said first and second remnant regions having respective edges adjacent to boundary lines between said channel region and said first and second main electrode regions, said first and second remnant regions respectively having first and second floating gates which are formed from said floating gate material layer, said first and second remnant regions respectively having first and second ONO films formed from said ONO film;
    a sixth step of forming an interlayer insulating film with a substantially uniform thickness so as to cover said first and second remnant regions and an upper surface of said semiconductor substrate;
    a seventh step of forming a control gate so as to fill a space between said first and second remnant regions and cover said interlayer insulating film; and
    an eighth step of removing said control gate, said interlayer insulating film, said first and second floating gates, and said first and second ONO films formed on said upper surface of said plurality of element isolation regions and upper surfaces of portions of said element region extending in said longitudinal direction of said element isolation region.

2. A method of manufacturing a semiconductor device comprising:
    a first step of preparing a semiconductor substrate including a plurality of element isolation regions disposed at substantially equal intervals in a direction perpendicular to a longitudinal direction of said element isolation regions and an element region exposed from said plurality of element isolation regions and doping impurities of a first conductive type into said element region, and forming a first conductive type impurity region in said element region of said semiconductor substrate;

a second step of forming a lower oxide film, a charge storage nitride film, and an upper oxide film in sequence so as to cover over an upper surface of said semiconductor substrate and forming an ONO film including said lower oxide film, said charge storage nitride film, and said upper oxide film;

a third step of forming a gate formation sacrificial film on a portion of said ONO film;

a fourth step of forming a floating gate material layer so as to cover an upper surface of said ONO film and said gate formation sacrificial film;

a fifth step of partially removing said floating gate material layer so as to form remnant portions of said floating gate material layer as first and second floating gates sandwiching said gate formation sacrificial film;

a sixth step of doping impurities having a second conductivity type whose conductivity is oppose to said first conductivity type into said first conductive type impurity region while utilizing said first and second floating gates as a mask so as to form first and second main electrode regions having said second conductivity type and a channel region having said first conductivity type, said cannel region sandwiched by said first and second main electrode regions being positioned below said gate formation sacrificial film and said first and second floating gates;

a seventh step of removing said gate formation sacrificial film and said ONO film excluding portions thereof under said first and second floating gates so as to form separate first and second remnant regions substantially parallel to each other extending in a direction perpendicular to said longitudinal direction of said plurality of element isolation regions, said first and second remnant regions respectively having first and second floating gates which are formed from said floating gate material layer, said first and second remnant regions respectively having first and second ONO films formed from said ONO film;

a eighth step of forming an interlayer insulating film with a substantially uniform thickness so as to cover said first and second remnant regions and an upper surface of said semiconductor substrate;

a ninth step of forming a control gate so as to fill a space between said first and second remnant regions and cover over said interlayer insulating film; and an tenth step of removing said control gate, said interlayer insulating film, said first and second floating gates, and first and second ONO films which are formed on said upper surface of said plurality of element isolation regions and upper surfaces of portions of said element region extending in said longitudinal direction of said element isolation region.

* * * * *